(12) United States Patent
Han

(10) Patent No.: US 9,660,058 B2
(45) Date of Patent: May 23, 2017

(54) METHOD OF FINFET FORMATION

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Qiuhua Han, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 19 days.

(21) Appl. No.: 14/612,186

(22) Filed: Feb. 2, 2015

(65) Prior Publication Data
US 2015/0228765 A1    Aug. 13, 2015

(30) Foreign Application Priority Data

Feb. 8, 2014  (CN) .......................... 2014 1 0045930

(51) Int. Cl.
*H01L 21/3105* (2006.01)
*H01L 21/311* (2006.01)
(Continued)

(52) U.S. Cl.
CPC .. *H01L 29/66795* (2013.01); *H01L 21/02282* (2013.01); *H01L 21/3081* (2013.01);
(Continued)

(58) Field of Classification Search
CPC ..................... H01L 21/3081; H01L 21/31055
See application file for complete search history.

(56) References Cited

U.S. PATENT DOCUMENTS 6,008,079 A * 12/1999 Wu ................... H01L 27/11521
257/E21.682
2003/0183875 A1 * 10/2003 Isobe .................. H01L 21/2022
257/347
(Continued)

*Primary Examiner* — Caleb Henry
*Assistant Examiner* — Mounir Amer
(74) *Attorney, Agent, or Firm* — Kilpatrick Townsend & Stockton LLP

(57) ABSTRACT

A method of fabricating a fin for a FinFET device includes providing a semiconductor substrate, forming a patterned silicon germanium layer on the semiconductor substrate, epitaxially growing a silicon layer on a top surface and sidewalls of the patterned silicon germanium layer, forming a sacrificial layer covering the patterned silicon germanium layer, and removing the sacrificial layer and a portion of the silicon layer disposed on the top surface of the patterned silicon germanium layer until a top surface of the sacrificial layer is co-planar with the top surface of the patterned silicon germanium layer. The method further includes removing the patterned silicon germanium layer and removing the sacrificial layer to form the fin. The epitaxially formed fin does not have the issues of line width roughness and edge roughness to improve the performance of the FinFET device.

20 Claims, 8 Drawing Sheets

(51) Int. Cl.
  *H01L 29/66* (2006.01)
  *H01L 29/161* (2006.01)
  *H01L 21/306* (2006.01)
  *H01L 21/308* (2006.01)
  *H01L 21/02* (2006.01)

(52) U.S. Cl.
  CPC .. *H01L 21/30604* (2013.01); *H01L 21/31055* (2013.01); *H01L 21/31116* (2013.01); *H01L 21/31138* (2013.01)

(56) References Cited

U.S. PATENT DOCUMENTS

| | | | | |
|---|---|---|---|---|
| 2006/0270127 | A1* | 11/2006 | Lai | H01L 21/823857 438/157 |
| 2006/0292772 | A1* | 12/2006 | Anderson | H01L 21/823412 438/197 |
| 2007/0099350 | A1* | 5/2007 | Zhu | H01L 21/84 438/142 |
| 2009/0208850 | A1* | 8/2009 | Ito | B82Y 10/00 430/5 |
| 2010/0052021 | A1* | 3/2010 | Mocho | H01L 28/55 257/295 |
| 2011/0294257 | A1* | 12/2011 | Shukla | H01L 51/0026 438/99 |
| 2013/0037869 | A1* | 2/2013 | Okano | H01L 29/66795 257/288 |
| 2014/0175554 | A1* | 6/2014 | Loubet | H01L 21/823431 257/368 |
| 2014/0264485 | A1* | 9/2014 | Li | H01L 21/823431 257/288 |

* cited by examiner

METHOD OF FINFET FORMATION

CROSS-REFERENCES TO RELATED APPLICATIONS

This application claims priority to Chinese patent application No. 201410045930.9, filed on Feb. 8, 2014, the content of which is incorporated herein by reference in its entirety.

BACKGROUND OF THE INVENTION

The present invention relates to semiconductor manufacturing technology, and more particularly to a method of forming a FinFET device.

Fin field-effect transistor (FinFET) technology is used in advanced semiconductor devices with technology nodes at or below 22 nm to effectively control the short channel effects that arise as the channel length of the transistor is reduced by scaling.

A conventional fabrication process of a FinFET device typically includes the following steps; first, a buried oxide layer is formed on a silicon substrate to obtain a silicon-on-insulator (SOI) structure, a silicon layer is then formed on the silicon-on-insulator structure. The silicon layer may be monocrystalline silicon or polycrystalline silicon. Next, the silicon layer is patterned and etched to form the fin for the FinFET. Thereafter, a gate electrode is formed on opposite sides of the fin, and a stress layer of silicon germanium is formed on opposite ends of the fin.

The conventional process of fabricating a FinFET structure faces substantial challenges, as the height of the fin is between about 30 nm and about 40 nm at the 22 nm or smaller technology node, the fin width is then only between about 12 nm and about 17 nm corresponding to a certain aspect ratio. Thus, the process of fabricating a fin requires the use of smaller lithographic and etch feature size, leading to a limit of the resolution of lithographic and etch processes, so that the fin may be prone to structural collapse during the patterning of the fin. Furthermore, there may be a substantial fluctuation in the threshold voltage of the fin formed by the conventional process due to deviation in the process control of the line width and edge roughness of the fin.

Therefore, a need exists for a method of fabricating a fin having a uniform shape and size without using the patterning and etch processes.

BRIEF SUMMARY OF THE INVENTION

Embodiments of the present invention relate to a method of manufacturing semiconductor devices, and more particularly to a method of manufacturing a fin for a FinFET device that does not have issues of line width roughness and edge roughness as fabricated using conventional lithographic techniques. In accordance with the present invention, the thus formed fin has a uniform line width and edge that can be accurately controlled.

Embodiments of the present invention provide a method of fabricating a fin for a FinFET device. The method includes providing a semiconductor substrate, forming a patterned silicon germanium layer on the semiconductor substrate, and epitaxially growing a silicon layer on a top surface and sidewalls of the patterned silicon germanium layer. The method also includes forming a sacrificial layer covering the patterned silicon germanium layer, and removing the sacrificial layer and a portion of the silicon layer disposed on the top surface of the patterned silicon germanium layer until a top surface of the sacrificial layer is co-planar with the top surface of the patterned silicon germanium layer. The method further includes removing the patterned silicon germanium layer and removing the sacrificial layer to form the fin. The epitaxially formed fin has uniform line width and edge to improve the performance of the FinFET device.

In an embodiment, forming the patterned silicon germanium layer may include forming a silicon germanium layer on the semiconductor substrate, forming a patterned photoresist layer on the silicon germanium layer, etching the silicon germanium layer using the patterned photoresist layer as a mask to form the patterned silicon germanium layer, and removing the patterned photoresist layer by ashing.

In another embodiment, forming the patterned silicon germanium layer may include forming a silicon germanium layer on the semiconductor substrate, forming a patterned photoresist layer on the silicon germanium layer, etching the silicon germanium layer and the semiconductor substrate using the patterned photoresist layer as a mask to form a trench, and removing the patterned photoresist layer by ashing.

In an embodiment, the trench may has a depth greater than or equal to 50 nm, preferably in the range between 60 nm and 300 nm.

In an embodiment, the method may further include filling the trench with an insulating material prior to epitaxially growing the silicon layer. The insulating material is an oxide layer having a top surface lower than the top surface of the semiconductor substrate. In an embodiment, the distance between the top surface of the oxide layer and the top surface of the semiconductor substrate is greater than or equal to 10 nm.

In an embodiment, the oxide layer is formed by depositing an oxide material filling the trench, performing a chemical mechanical polishing process on the oxide material to expose the top surface of the silicon germanium layer, and etching back the oxide material to form the oxide layer.

In an embodiment, the oxide layer has a thickness in the range between 100 nm and 500 nm. Etching back comprises an etching gas including $CF_4$ and $CHF_3$, the flow rate of $CF_4$ in the range between 10 nm and 100 sccm, the flow rate of $CHF_3$ in a range between 10 nm and 100 sccm, and the power in a range between 100 W and 1000 W.

In an embodiment, the patterned silicon-germanium layer has a thickness in the range between 10 nm and 100 nm and the germanium concentration in the range between 20% and 80%, and the silicon layer has a thickness in the range between 3 nm and 30 nm.

In an embodiment, the sacrificial layer comprises includes an organic material and is formed using a spin-on coating process.

In an embodiment, etching back the sacrificial layer includes using $O_2$ and $SO_2$ gases under the pressure in the range between 2 mTorr and 10 mTorr, with the power in the range between 100 W and 1000 W, the flow rate of $O_2$ in the range between 2 sccm and 50 sccm, and the flow rate of $SO_2$ in the range between 2 sccm and 50 sccm.

In an embodiment, removing the portion of the silicon layer disposed on the top surface of the patterned silicon germanium layer includes using HBr, $Cl_2$ and $O_2$ gases, under the pressure in the range between 2 mTorr and 10 mTorr, with the power in the range between 100 W and 1000 W, the flow rate of HBr in the range between 10 sccm and 500 sccm, the flow rate of Cl$_2$ in the range between 10 sccm and 100 sccm, and a flow rate of O$_2$ in a range between 2 sccm and 10 sccm.

In an embodiment, the patterned silicon germanium layer is removed using a wet etch process with an etchant solution including a mixture of HF, H$_2$O$_2$ and CH$_3$COOH.

In an embodiment, the sacrificial layer is removed by dry ashing or wet etching. The dry ashing may include a plasma gas source containing oxygen or nitrogen, and hydrogen as a carrier gas. The wet etching may include a H$_2$SO$_4$ solution.

In an embodiment, the method further includes forming a buried oxide layer overlying a surface of the semiconductor substrate.

In an embodiment, the method also includes forming a silicon nitride layer between the buried oxide layer and the patterned silicon germanium layer. The silicon nitride layer has a thickness in the range between 2 nm and 10 nm.

In an embodiment, the method also includes, after removing the sacrificial layer, removing the silicon nitride layer by wet etching with a H3PO4 solution.

According to the present invention, the epitaxially grown fin does not have the issues of line width roughness and edge roughness associated the conventional lithographic processes. The uniform line width and edge of the thus formed fin improves the performance of the FinFET device.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

DETAILED DESCRIPTION OF THE INVENTION

Figure 1A:
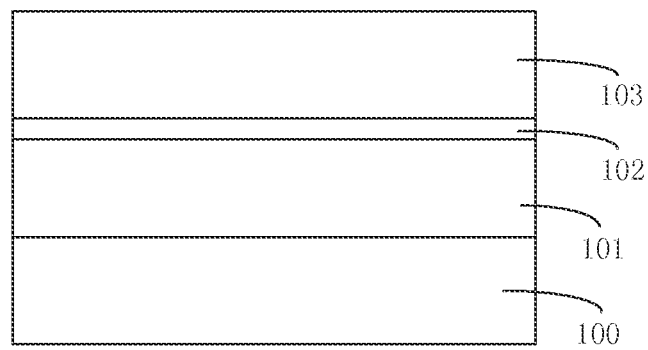
FIG. 1A is a cross-sectional view of a structure in the manufacturing process of a semiconductor device according to a first embodiment of the present invention.

The present invention will be understood more fully from the detailed description given below and from the accompanying drawings of the preferred embodiments of the invention, which, however, should not be taken to limit the invention to the specific embodiments, but are for explanation and understanding only.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, tier example, from manufacturing. Furthermore, the terminology as used herein is for the purpose of describing example embodiments only and is not intended to be a limitation of the invention. In this respect, as used herein, the term "in" may include "within" and "on", and the terms "a", "an" and "the" may include singular and plural references.

It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof.

Figure 3:
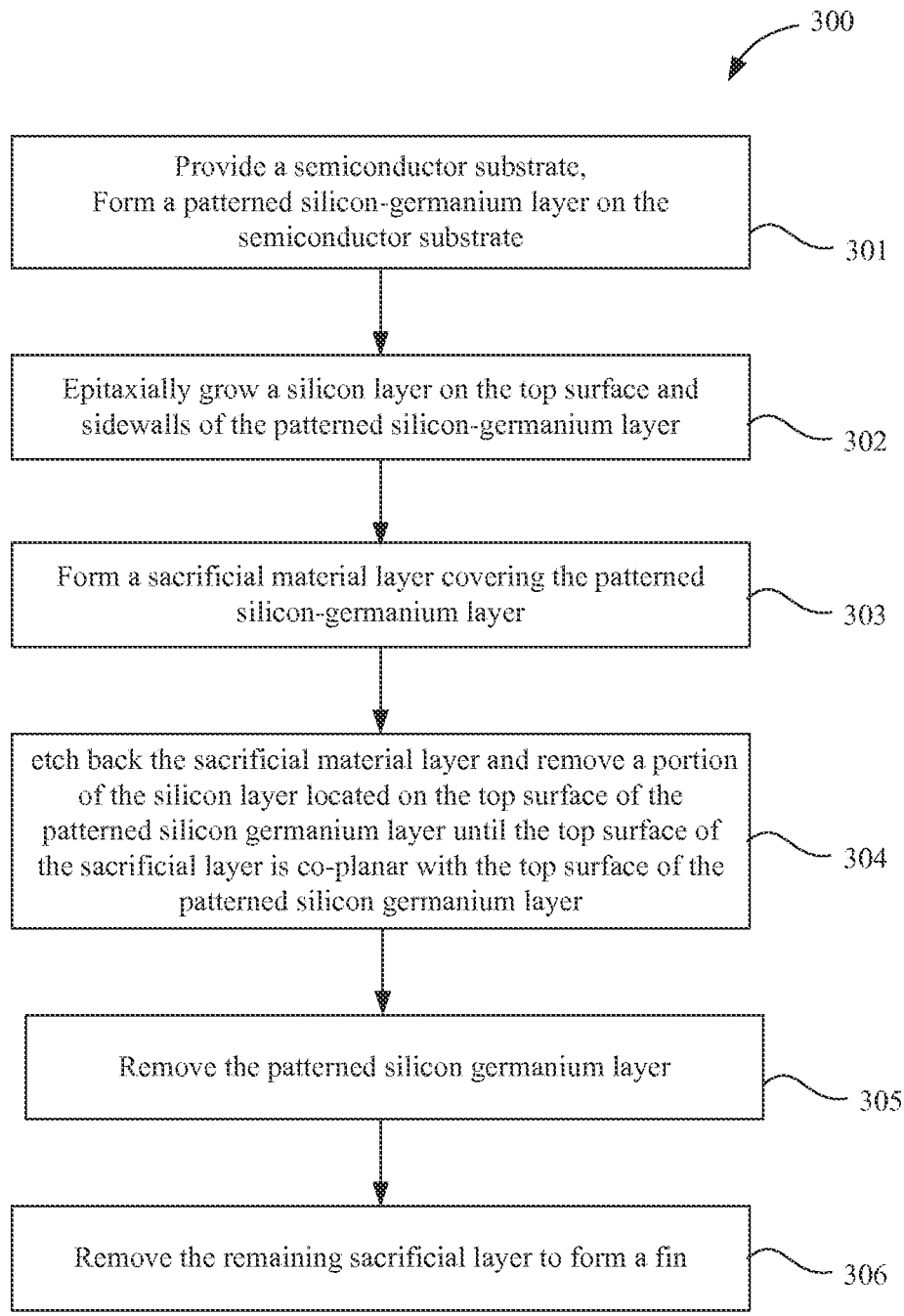
FIG. 3 is a simplified flow chart of a method for fabricating a fin for a FinFET device according to an embodiment of the present invention.

The present invention has been made to solve the limit of lithographic and etch processes of the prior art. Embodiments of the present invention provide a method of epitaxially forming a fin with a predetermined shape and size. In some exemplary embodiments, the fin width can be accurately controlled by epitaxially growing a silicon layer, which is much more uniform than the fin formed by lithographic processes in conventional techniques. FIG. 3 is a simplified flow chart illustrating the steps taken to fabricate a fin for a FinFET device in accordance with the present invention.

Exemplary Embodiment 1

FIGS. 1A through 1F illustrate cross-sectional views of intermediate stages of a method of fabricating a semiconductor device, such as a fin field-effect transistor according to an exemplary embodiment of the present invention. FIG. 1A shows a structure in the starting process step.

As shown in FIG. 1A, a semiconductor substrate 100 is provided. Semiconductor substrate 100 may be undoped single crystal silicon or doped single crystal silicon. A buried oxide layer 101, a silicon nitride layer 102, and a silicon germanium layer 103 are sequentially deposited on semiconductor substrate 100. In an embodiment, a low pressure chemical vapor deposition (LPCVD), plasma enhanced chemical vapor deposition (PECVD), ultra high-vacuum chemical vapor deposition (UHVCVD), rapid thermal chemical vapor deposition (RTCVD), physical vapor deposition (PVD), atomic layer deposition (ALD), and molecular beam epitaxy (MBE) process may be used. In an embodiment, buried oxide layer 101 is a silicon oxide layer, silicon nitride layer 102 has a thickness in the range between about 2 nm and about 10 nm, silicon-germanium layer 103 has a thickness in the range between about 10 nm and about 100 nm, and the germanium concentration in silicon-germanium layer 103 is in the range between about 20% and about 80%.

Figure 1B:
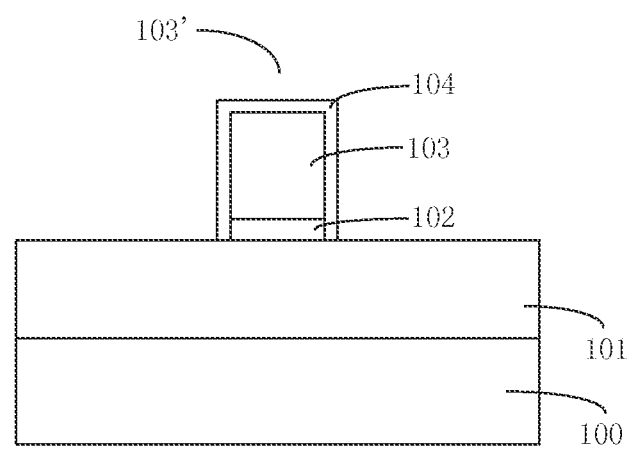
FIG. 1B is a cross-sectional view of an intermediate structure after etching and epitaxially growing a silicon layer of FIG. 1A according to the first embodiment of the present invention.

Next, as shown in FIG. 1B, silicon-germanium layer 103 and silicon nitride layer 102 are patterned to form a stacked structure 103'. Patterning silicon-germanium layer 103 and silicon nitride layer 102 may include forming a patterned photoresist (not shown) and removing a portion of silicon-germanium layer 103 and silicon nitride layer 102 by etching using the patterned photoresist as a mask to form the stacked structure 103', and the photoresist is then removed by ashing.

Next, a silicon layer 104 is formed on the top surface and sidewalls of stacked structure 103'. In an embodiment, silicon layer 104 may be formed by one of a low pressure chemical vapor deposition (LPCVD), plasma enhanced chemical vapor deposition (PECVD), ultra high-vacuum chemical vapor deposition (UHVCVD), rapid thermal chemical vapor deposition (RTCVD), physical vapor deposition (PVD), and molecular beam epitaxy (MBE) process. In an embodiment, silicon layer 104 has a thickness in the range between 3 nm and 30 nm.

Figure 1C:
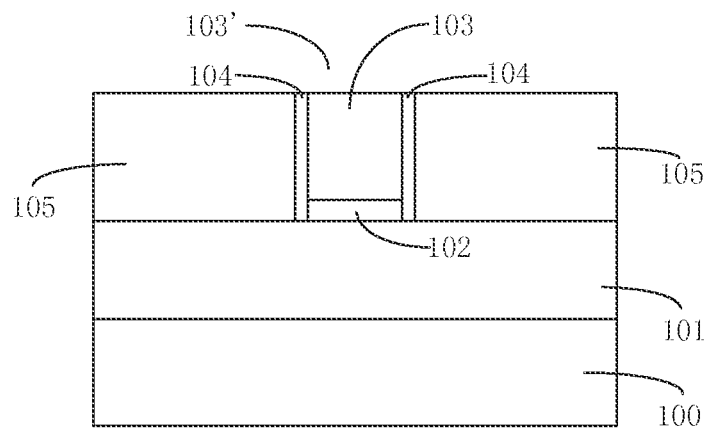
FIG. 1C is a cross-sectional view of an intermediate structure after forming a sacrificial layer of FIG. 1B according to the first embodiment of the present invention.

Next, as shown in FIG. 1C, a sacrificial material layer 105 is formed on silicon layer 104 and buried oxide layer 101. In an embodiment, sacrificial material layer 105 is of an organic material and can be formed by a spin-on coating process.

Then, sacrificial material layer 105 is etched back and a portion of silicon layer 104 located at the top surface of stacked structure 103' is removed until the exposed top surface of stacked structure 103' is flush (co-planar) with the surface of sacrificial material layer 105. Etching back the sacrificial material layer 105 may include the following process parameters: an etching gas comprising $O_2$ and $SO_2$, the flow rate of $O_2$ is about 2-50 sccm, the flow rate of $SO_2$ is about 2-50 sccm, the power is about 100-1000 W, and the pressure is about 2-10 mTorr. Removing the top surface of stacked structure 103' may include the following process parameters: an etching gas comprising HBr, $Cl_2$ and $O_2$, the flow rate of HBr is about 10-500 sccm, the flow rate of $Cl_2$ is about 10-100 sccm, the flow rate of $O_2$ is about 2-10 sccm, the power is about 100-1000 W, and the pressure is about 2-10 mTorr. Etching back sacrificial material layer 105 may include the following steps: sacrificial layer 105 is first etched back until a portion of silicon layer 104 located on the top surface of stacked structure 104 is exposed; next, the exposed portion of silicon layer 104 located on the top surface of stacked structure 104 is etched back. Then, sacrificial material layer 105 is again etched back until the top surface of sacrificial material layer 105 is co-planar with the top surface of stacked structure 103'.

Figure 1D:
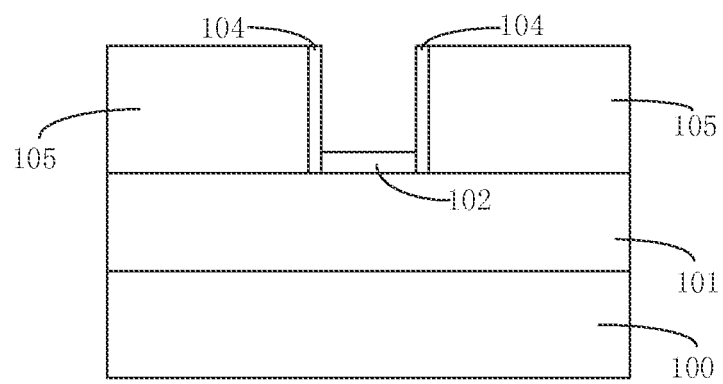
FIG. 1D is a cross-sectional view of an intermediate structure after removing the silicon germanium layer of FIG. 1C according to the first embodiment of the present invention.

Subsequently, as shown in FIG. 1D, silicon-germanium layer 103 in stacked structure 103' is removed. In an embodiment, silicon-germanium layer 103 is selectively etched using a wet etch process. The wet etching is performed with an etchant solution comprising a mixture of HF, $H_2O_2$ and $CH_3COOH$, where the ratio of HF:$H_2O_2$:$CH_3COOH$ is 1:2:3.

Figure 1E:
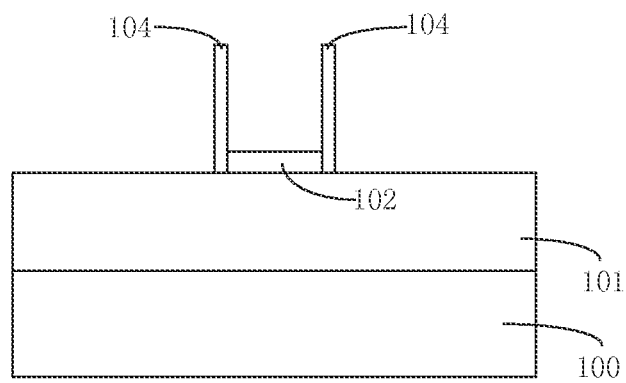
FIG. 1E is a cross-sectional view of an intermediate structure after removing the sacrificial layer of FIG. 1D according to the first embodiment of the present invention.

Thereafter, as shown in FIG. 1E, the remaining sacrificial material layer 105 is removed from the structure. In an embodiment, the remaining sacrificial material layer 105 can be removed using dry ashing or wet etching. Dry ashing may be carried out with a plasma gas source including oxygen or nitrogen, and the carrier gas is hydrogen. Wet etching includes a $H_2SO_4$ solution.

Figure 1F:
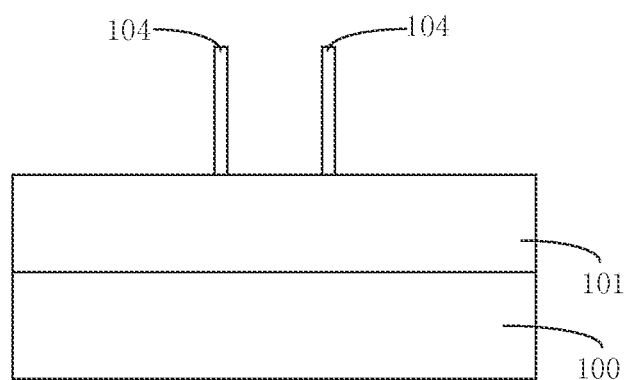
FIG. 1F is a cross-sectional view of a structure after removing the silicon nitride layer of FIG. 1E to form a fin of a FinFET device according to the first embodiment of the present invention.

Thereafter, as shown in FIG. 1F, silicon nitride layer 102 within stacked structure 103' is removed. In an embodiment, silicon nitride layer 102 is removed by wet etching with an etchant solution of $H_3PO_4$. After the removal of the silicon nitride layer, the silicon layer 104 on the buried oxide layer 101 forms the fins of FinFET devices.

Exemplary Embodiment 2

FIGS. 2A through 2F illustrate cross-sectional views of intermediate stages of a method of fabricating a semiconductor device, such as a fin field-effect transistor according to another exemplary embodiment of the present invention.

Figure 2A:
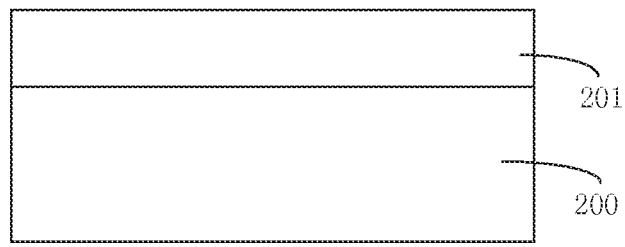
FIG. 2A is a cross-sectional view of a structure in the manufacturing process of a semiconductor device according to a second embodiment of the present invention.

As shown in FIG. 2A, a semiconductor substrate 200 is provided. Semiconductor substrate 200 may be undoped single crystal silicon or doped single crystal silicon. A silicon germanium layer 201 is formed on semiconductor substrate 200. In an embodiment, silicon germanium layer 201 may be formed by a low pressure chemical vapor deposition (LPCVD), plasma enhanced chemical vapor deposition (PECVD), ultra high-vacuum chemical vapor deposition (UHVCVD), rapid thermal chemical vapor deposition (RTCVD), physical vapor deposition (PVD), atomic layer deposition (ALD), or molecular beam epitaxy (MBE) process. In an embodiment, silicon germanium 201 has a thickness in the range between about 10 nm and about 100 nm and the germanium concentration in a range between about 20% and about 80%.

Figure 2B:
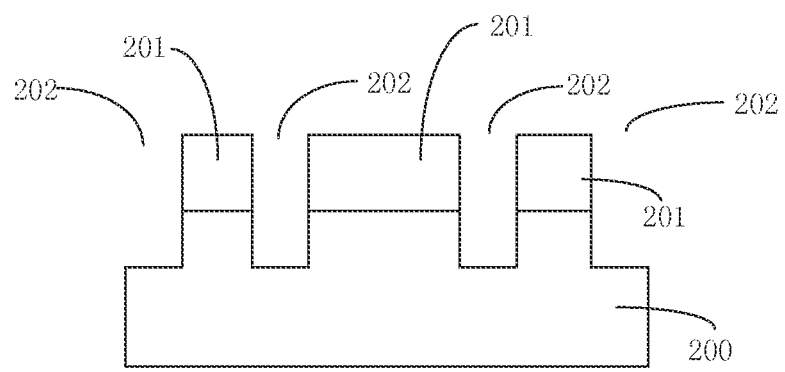
FIG. 2B is a cross-sectional view of an intermediate structure after patterning and etching of the structure of FIG. 2A according to the second embodiment of the present invention.

Next, as shown in FIG. 2B, silicon-germanium layer 201 and semiconductor substrate 200 are etched to form a trench 202. Forming trench 202 may include forming a patterned photoresist (not shown) on silicon-germanium layer 201, sequentially etching silicon-germanium layer 201 and semiconductor substrate 200 using the patterned photoresist as a mask to form trench 202, and removing the patterned photoresist by ashing. In some embodiments, trench 202 has a depth greater than or equal to 50 nm, and preferably in the range between about 60 nm and about 300 nm.

Figure 2C:
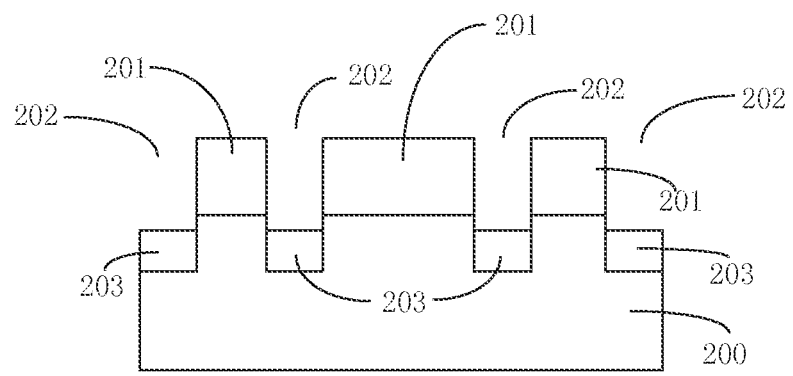
FIG. 2C is a cross-sectional view of an intermediate structure after forming an insulating material in the structure of FIG. 2B according to the second embodiment of the present invention.

Next, as shown in FIG. 2C, an insulating material 203 is filled in trench 202. In an embodiment, insulating material 203 is an oxide layer having a top surface, which is below the top surface of semiconductor substrate 200. In an embodiment, the distance between the top surface of the semiconductor substrate 200 and the top surface of the oxide layer is greater than or equal to 10 nm. In an embodiment, the oxide layer is a silicon oxide layer, which can be formed with the following steps: forming an oxide material to completely fill trench 202. In an embodiment, the oxide material has a thickness in the range between 100 nm and 500 nm. In an embodiment, the oxide material may be formed by a low pressure chemical vapor deposition (LP-CVD), plasma enhanced chemical vapor deposition (PECVD), ultra high-vacuum chemical vapor deposition (UHVCVD), rapid thermal chemical vapor deposition (RTCVD), physical vapor deposition (PVD), atomic layer deposition (ALD), or molecular beam epitaxy (MBE) process. Thereafter, a chemical mechanical polishing process is performed to expose the top surface of silicon germanium layer 201. Finally, the oxide material is etched back with an etching gas including $CF_4$ and $CHF_3$, the flow rate of $CF_4$ is in the range between 10 sccm and 100 sccm, the flow rate of $CHF_3$ is in the range between 10 sccm and 100 sccm, and a power in the range between 100 W and 1000 W.

Figure 2D:
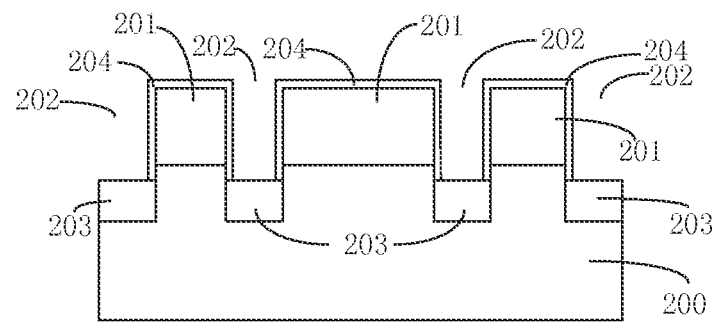
FIG. 2D is a cross-sectional view of an intermediate structure after forming a silicon layer on the structure of FIG. 2C according to the second embodiment of the present invention.

Next, as shown in FIG. 2D, a silicon layer 204 is formed on the top surface and sidewalls of silicon germanium layer 201 and on sidewalls of a portion of semiconductor substrate 200 located above insulating layer 203. In an embodiment, silicon layer 204 is formed by one of a low pressure chemical vapor deposition (LPCVD), plasma enhanced chemical vapor deposition (PECVD), ultra high-vacuum chemical vapor deposition (UHVCVD), rapid thermal chemical vapor deposition (RTCVD), or molecular beam epitaxy (MBE) process. In an embodiment, silicon layer 204 has a thickness in the range between 3 nm and 30 nm.

Figure 2E:
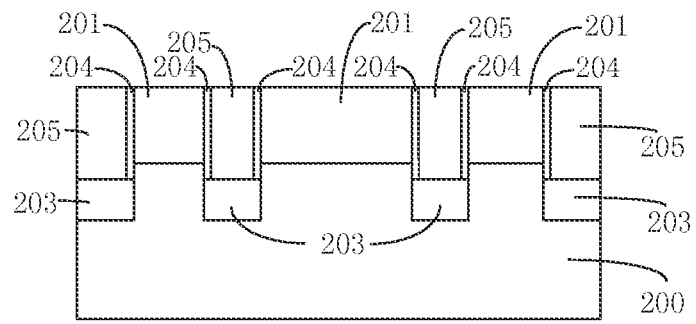
FIG. 2E is a cross-sectional view of an intermediate structure after forming a sacrificial layer on the structure of FIG. 2D according to the second embodiment of the present invention.

Next, as shown in FIG. 2E, a sacrificial material layer 205 is formed to cover silicon layer 204 and insulating material 203. In an embodiment, sacrificial layer 205 is formed using a spin-on coating process, and sacrificial layer 205 includes an organic material.

Thereafter, sacrificial layer 205 is etched back and a portion of silicon layer 204 located on the top surface of silicon germanium layer 201 is removed until the top surface of sacrificial layer 205 is co-planar with the top surface of silicon germanium layer 201. In an embodiment, etching back of sacrificial layer 205 may include an etching gas of $O_2$ and $SO_2$, the flow rate of $O_2$ is about 2-50 sccm, the flow rate of $SO_2$ is about 2-50 sccm, the power is about 100-1000 W, and the pressure is about 2-10 mTorr. Removing the portion of silicon layer 204 located on the top surface of silicon germanium layer 201 may include the following process parameters: an etching gas comprising HBr, $Cl_2$ and $O_2$, the flow rate of HBr is about 10-500 sccm, the flow rate of $Cl_2$ is about 10-100 sccm, the flow rate of $O_2$ is about 2-10 sccm, the power is about 100-1000 W, and the pressure is about 2-10 mTorr. Etching back may be carried out according to the following steps: sacrificial layer 205 is first etched back to expose a portion of silicon layer 204 located on the top surface of silicon germanium layer 201, then the portion of silicon layer 204 located on the top surface of silicon germanium layer 201 is removed by etching, and finally, sacrificial layer 205 is etched back until the top surface of sacrificial layer 205 is co-planar with the top surface of silicon germanium layer 201.

Figure 2F:
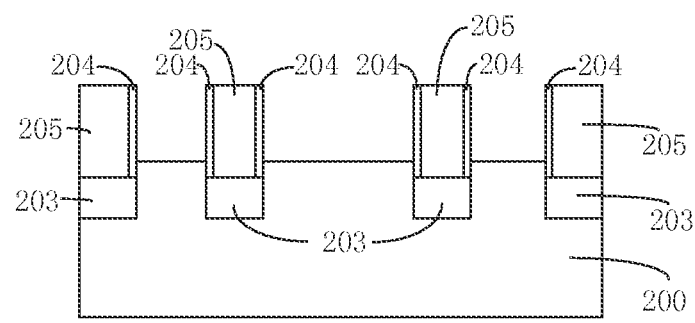
FIG. 2F is a cross-sectional view of an intermediate structure after removing the sacrificial layer from the structure of FIG. 2E according to the second embodiment of the present invention.

Thereafter, as shown in FIG. 2F, silicon germanium layer 201 is removed by etching. In an embodiment, silicon germanium layer 201 is selectively etched using a wet etch process. The wet etching is performed with an etchant solution comprising a mixture of HF, $H_2O_2$ and $CH_3COOH$, where the ratio of HF:$H_2O_2$:$CH_3COOH$ is 1:2:3.

Figure 2G:
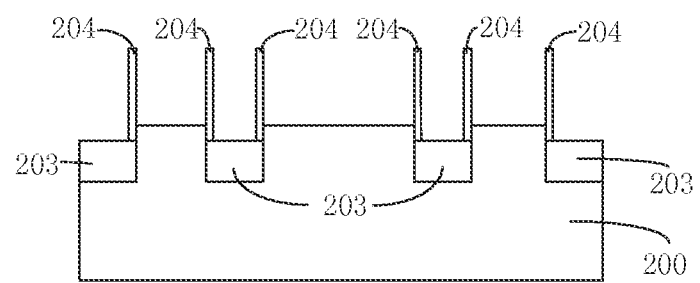
FIG. 2G is a cross-sectional view of a structure after removing the silicon germanium layer from the structure of FIG. 2E to form a fin of a FinFET device according to the second embodiment of the present invention.

Thereafter, as shown in FIG. 2G, the remaining sacrificial layer 205 is removed. In an embodiment, the remaining sacrificial layer 205 is removed using a dry ashing or wet etching process. Dry ashing may be carried out with a plasma gas source including oxygen or nitrogen, and hydrogen is the carrier gas. Wet etching includes a $H_2SO_4$ solution. After the removal of the remaining sacrificial layer, silicon layer 204 on insulating layer 203 forms the fins of FinFET devices.

This completes the process steps of the method of forming the fins of FinFET devices according to exemplary embodiments of the present invention. Subsequent process steps may include forming gate electrodes on opposite sides of the fins, and forming a stress layer of silicon germanium on opposite ends of the fins. In accordance with the present invention, the thus formed fins do not have the issues of fin line width roughness and edge (sidewalls) roughness in the patterning of the photoresist resulting from an inaccurate control of lithographic and etching in conventional techniques so that the FinFET devices have improved performance.

FIG. 3 a simplified flow chart of a method 300 for fabricating a fin for a FinFET device according to an embodiment of the present invention. Method 300 includes:

Step 301: providing a semiconductor substrate, forming a patterned silicon germanium layer on the semiconductor substrate;

Step 302: epitaxially growing a silicon layer on the top surface and sidewalls of the patterned silicon germanium layer;

Step 303: forming a sacrificial layer covering the patterned silicon germanium layer;

Step 304: etching back the sacrificial layer and removing a portion of the silicon layer located on the top surface of the silicon germanium layer until the top surface of the sacrificial layer is flush (co-planar) with the top surface of the silicon germanium layer;

Step 305: removing the silicon germanium layer;

Step 306: removing the sacrificial layer to form a fin.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of fabricating a fin for a FinFET device, the method comprising:
   providing a semiconductor substrate;
   forming a patterned silicon germanium layer on the semiconductor substrate;
   epitaxially growing a silicon layer on a top surface and sidewalls of the patterned silicon germanium layer;
   forming a sacrificial layer covering the patterned silicon germanium layer;
   etching back the sacrificial layer until a portion of the silicon layer disposed on the top surface of the patterned silicon germanium layer is exposed;
   etching back the exposed portion of the silicon layer;

etching back again the sacrificial layer until a top surface of the sacrificial layer is co-planar with the top surface of the patterned silicon germanium layer;
removing the patterned silicon germanium layer; and
removing the sacrificial layer to form the fin,
wherein etching back the sacrificial layer and etching back the exposed portion of the silicon layer are different etch processes.

2. The method of claim 1, wherein forming the patterned silicon germanium layer comprises:
forming a silicon germanium layer on the semiconductor substrate;
forming a patterned photoresist on the silicon germanium layer;
etching the silicon germanium layer using the patterned photoresist as a mask to form the patterned silicon germanium layer; and
removing the patterned photoresist by ashing.

3. The method of claim 1, wherein forming the patterned silicon germanium layer comprises:
forming a silicon germanium layer on the semiconductor substrate;
forming a patterned photoresist on the silicon germanium layer;
etching the silicon germanium layer and the semiconductor substrate using the patterned photoresist as a mask to form a trench; and
removing the patterned photoresist by ashing.

4. The method of claim 3, wherein the trench has a depth greater than or equal to 50 nm.

5. The method of claim 4, wherein the depth is in a range between 60 nm and 300 nm.

6. The method of claim 3, further comprising, prior to epitaxially growing the silicon layer, filling the trench with an insulating material.

7. The method of claim 6, wherein the insulating material is an oxide layer having a top surface below a top surface of the semiconductor substrate.

8. The method of claim 7, wherein a distance between the top surface of the oxide layer and the top surface of the semiconductor substrate is greater than or equal to 10 nm.

9. The method of claim 7, wherein the oxide layer is formed by:
depositing an oxide material filling the trench;
performing a chemical mechanical polishing process on the oxide material to expose the top surface of the silicon germanium layer; and
etching back the oxide material to form the oxide layer.

10. The method of claim 9, wherein the oxide layer has a thickness in a range between 100 nm and 500 nm, and the etching back comprises an etching gas including $CF_4$ and $CHF_3$, a flow rate of $CF_4$ in a range between 10 sccm and 100 sccm, a flow rate of $CHF_3$ in a range between 10 sccm and 100 sccm, and a power in a range between 100 W and 1000 W.

11. The method of claim 1, wherein the patterned silicon-germanium layer has a thickness in a range between 10 nm and 100 nm and a germanium concentration in a range between 20% and 80%, and the silicon layer has a thickness in a range between 3 nm and 30 nm.

12. The method of claim 1, wherein forming the sacrificial layer comprises forming the sacrificial layer including an organic material using a spin-on coating process.

13. The method of claim 1, wherein etching back the sacrificial layer comprises using $O_2$ and $SO_2$ gases under a pressure in a range between 2 mTorr and 10 mTorr, with a power in a range between 100 W and 1000 W, a flow rate of $O_2$ in a range between 2 sccm and 50 sccm, and a flow rate of $SO_2$ in a range between 2 sccm and 50 sccm.

14. The method of claim 1, wherein removing the portion of the silicon layer disposed on the top surface of the patterned silicon germanium layer comprises using HBr, $Cl_2$ and $O_2$ gases, under a pressure in a range between 2 mTorr and 10 mTorr, with a power in a range between 100 W and 1000 W, a flow rate of HBr in a range between 10 sccm and 500 sccm, a flow rate of $Cl_2$ in a range between 10 sccm and 100 sccm, and a flow rate of $O_2$ in a range between 2 sccm and 10 sccm.

15. The method of claim 1, wherein removing the patterned silicon germanium layer comprises a wet etch process with an etchant solution including a mixture of HF, $H_2O_2$ and $CH_3COOH$.

16. The method of claim 1, wherein removing the sacrificial layer comprises dry ashing or wet etching, the dry ashing comprising a plasma gas source including oxygen or nitrogen, and hydrogen as a carrier gas, and the wet etching includes a $H_2SO_4$ solution.

17. The method of claim 1, further comprising:
forming a buried oxide layer overlying a surface of the semiconductor substrate.

18. The method of claim 17, further comprising:
forming a silicon nitride layer between the buried oxide layer and the patterned silicon germanium layer.

19. The method of claim 18, wherein the silicon nitride layer has a thickness in a range between 2 nm and 10 nm.

20. The method of claim 18, further comprising, after removing the sacrificial layer:
removing the silicon nitride layer by wet etching with a $H_3PO_4$ solution.

* * * * *